(12) United States Patent
Cook

(10) Patent No.: US 9,157,190 B2
(45) Date of Patent: Oct. 13, 2015

(54) METHOD FOR TREATING SUBSTRATES WITH HALOSILANES

(75) Inventor: Leon Neal Cook, Midland, MI (US)

(73) Assignee: Petra International Holdings, LLC, Crestview, FL (US)

( * ) Notice: Subject to any disclaimer, the term of this patent is extended or adjusted under 35 U.S.C. 154(b) by 0 days.

(21) Appl. No.: 13/980,148

(22) PCT Filed: Jan. 5, 2012

(86) PCT No.: PCT/US2012/020284
§ 371 (c)(1),
(2), (4) Date: Jul. 17, 2013

(87) PCT Pub. No.: WO2012/099719
PCT Pub. Date: Jul. 26, 2012

(65) Prior Publication Data
US 2013/0294996 A1  Nov. 7, 2013

Related U.S. Application Data

(60) Provisional application No. 61/433,616, filed on Jan. 18, 2011.

(51) Int. Cl.
| | |
|---|---|
| *C23C 16/00* | (2006.01) |
| *D21H 23/06* | (2006.01) |
| *C23C 16/455* | (2006.01) |
| *D06M 13/51* | (2006.01) |
| *D06M 13/513* | (2006.01) |
| *D06M 13/517* | (2006.01) |
| *D06M 15/643* | (2006.01) |

(Continued)

(52) U.S. Cl.
CPC ............... *D21H 23/06* (2013.01); *B05D 5/00* (2013.01); *C23C 16/45506* (2013.01); *D06M 13/51* (2013.01); *D06M 13/513* (2013.01); *D06M 13/517* (2013.01); *D06M 15/643* (2013.01); *D06M 15/657* (2013.01); *D21H 17/59* (2013.01); *D21H 21/16* (2013.01); *D06M 2200/12* (2013.01)

(58) Field of Classification Search
CPC .............. C23C 16/45506; C23C 16/56; C23C 16/4401
USPC .................... 427/248.1, 254, 255.5
See application file for complete search history.

(56) References Cited

U.S. PATENT DOCUMENTS 2,306,222 A * 12/1942 Patnode ..................... 442/81
2,386,259 A    10/1945 Norton
(Continued)

FOREIGN PATENT DOCUMENTS

CN    101104763    1/2008
DE    1277192    9/1968
(Continued)

OTHER PUBLICATIONS

Interaction of Silane Coupling Agents with Cellulose by Mekki Abdelmouleh et al., American Chemical Society, Mar. 19, 2002, pp. 3203-3208.

(Continued)

*Primary Examiner* — Elizabeth Burkhart
(74) *Attorney, Agent, or Firm* — Greenberg Traurig, LLP

(57) ABSTRACT

A method for treating substrates to render them hydrophobic includes penetrating the substrate with a halosilane vapor.

18 Claims, 1 Drawing Sheet

(51) Int. Cl.
  *D06M 15/657* (2006.01)
  *D21H 17/59* (2006.01)
  *D21H 21/16* (2006.01)
  *B05D 5/00* (2006.01)

(56) References Cited

U.S. PATENT DOCUMENTS

| | | |
|---|---|---|
| 2,412,470 A | 12/1946 | Norton |
| 2,612,482 A | 9/1952 | Rasmussen |
| 2,615,824 A | 10/1952 | Minor et al. |
| 2,647,136 A | 7/1953 | Sauer |
| 2,782,090 A | 2/1957 | Robbart |
| 2,802,850 A | 8/1957 | Wetzel |
| 2,824,778 A | 2/1958 | Robbart |
| 2,869,722 A | 1/1959 | Marander et al. |
| 2,961,338 A | 11/1960 | Robbart |
| 2,995,470 A | 8/1961 | Robbart |
| 3,046,155 A | 7/1962 | Reinke |
| 3,129,054 A * | 4/1964 | Robbart ............... 8/128.3 |
| 3,418,312 A | 12/1968 | Klebe |
| 3,607,901 A | 9/1971 | Berger |
| 3,637,570 A | 1/1972 | Stout |
| 3,682,675 A | 8/1972 | Myers |
| 3,806,549 A | 4/1974 | Foley |
| 3,856,558 A | 12/1974 | Robbart |
| 3,879,206 A | 4/1975 | Nestler et al. |
| 3,986,999 A | 10/1976 | Sattlegger et al. |
| 4,002,800 A | 1/1977 | Nestler et al. |
| 4,013,474 A | 3/1977 | Teitell et al. |
| 4,028,391 A | 6/1977 | Foley |
| 4,109,032 A | 8/1978 | Barrall |
| 4,151,327 A | 4/1979 | Lawton |
| 4,170,690 A | 10/1979 | Armbruster et al. |
| 4,339,479 A * | 7/1982 | Robbart ............... 427/255.24 |
| 4,349,610 A | 9/1982 | Parker |
| 4,386,134 A | 5/1983 | Puhringer |
| 4,423,112 A | 12/1983 | Luthringshauser et al. |
| 4,491,669 A | 1/1985 | Arkles et al. |
| 4,498,538 A | 2/1985 | Watkins et al. |
| 4,534,815 A | 8/1985 | Hamada et al. |
| 4,544,413 A | 10/1985 | Boots et al. |
| 4,551,385 A | 11/1985 | Robbart |
| 4,554,215 A | 11/1985 | Robbart |
| 4,554,331 A | 11/1985 | Fey et al. |
| 4,567,221 A | 1/1986 | Maruyama et al. |
| 4,581,243 A | 4/1986 | Kelsoe |
| 4,835,014 A | 5/1989 | Roth et al. |
| 4,847,088 A | 7/1989 | Blank |
| 4,851,558 A | 7/1989 | Nishida et al. |
| 4,859,359 A | 8/1989 | DeMatteo et al. |
| 4,962,076 A | 10/1990 | Chu et al. |
| 5,051,129 A | 9/1991 | Cuthbert et al. |
| 5,051,455 A | 9/1991 | Chu et al. |
| 5,053,442 A | 10/1991 | Chu et al. |
| 5,073,195 A | 12/1991 | Cuthbert et al. |
| 5,120,581 A | 6/1992 | Brunken et al. |
| 5,204,186 A | 4/1993 | Brunken et al. |
| 5,294,252 A | 3/1994 | Gun |
| 5,374,761 A | 12/1994 | Bank |
| 5,389,322 A | 2/1995 | Kim et al. |
| 5,407,709 A | 4/1995 | Ogawa et al. |
| 5,413,808 A | 5/1995 | Wyner |
| 5,565,592 A | 10/1996 | Patsidis et al. |
| 5,645,751 A | 7/1997 | Haley |
| 5,652,026 A | 7/1997 | Saka et al. |
| 5,689,754 A | 11/1997 | Yoshida et al. |
| 5,871,817 A | 2/1999 | Nasheri |
| 5,954,869 A | 9/1999 | Elfersy et al. |
| 5,990,043 A | 11/1999 | Kugler et al. |
| 5,998,536 A | 12/1999 | Bertry |
| 6,120,587 A | 9/2000 | Elfersy et al. |
| 6,342,268 B1 | 1/2002 | Samain |
| 6,469,120 B1 | 10/2002 | Elfersy et al. |
| 6,607,564 B2 | 8/2003 | Soane et al. |
| 6,663,979 B2 | 12/2003 | Deodhar et al. |
| 6,676,733 B2 | 1/2004 | Ludwig et al. |
| 6,740,357 B2 | 5/2004 | Yamaguchi et al. |
| 6,902,767 B2 | 6/2005 | Kelsoe |
| 6,916,507 B2 | 7/2005 | Matsumura et al. |
| 6,959,465 B1 | 11/2005 | Foster |
| 7,022,291 B1 | 4/2006 | Beholz |
| 7,128,778 B2 | 10/2006 | Thompson |
| 7,192,470 B2 | 3/2007 | Neal et al. |
| 7,205,422 B2 | 4/2007 | Norman |
| 7,267,714 B2 | 9/2007 | Thompson |
| 7,291,215 B2 | 11/2007 | Oike et al. |
| 7,300,502 B2 | 11/2007 | Thompson |
| 7,417,749 B1 | 8/2008 | Simpson et al. |
| 7,425,367 B2 | 9/2008 | O'Rear, III et al. |
| 7,432,387 B2 | 10/2008 | Komuro et al. |
| 7,459,213 B2 | 12/2008 | Yamamoto |
| 7,463,572 B2 | 12/2008 | Frommer et al. |
| 7,553,363 B2 | 6/2009 | Dellinger et al. |
| 7,754,288 B2 | 7/2010 | Neal et al. |
| 7,758,924 B2 | 7/2010 | Thompson |
| 7,964,031 B2 | 6/2011 | Neal et al. |
| 7,964,287 B2 | 6/2011 | Thompson |
| 7,973,108 B2 | 7/2011 | Okamoto et al. |
| 2002/0048679 A1 | 4/2002 | Lohmer et al. |
| 2002/0096284 A1 | 7/2002 | Iwamiya et al. |
| 2002/0110644 A1 | 8/2002 | Kelsoe |
| 2003/0059545 A1 | 3/2003 | Kelsoe |
| 2003/0087035 A1 | 5/2003 | Kelsoe |
| 2005/0153152 A1 | 7/2005 | Kelsoe |
| 2005/0186348 A1 | 8/2005 | Kelsoe |
| 2005/0271821 A1 | 12/2005 | Lee et al. |
| 2006/0008840 A1 | 1/2006 | Goldberg et al. |
| 2006/0088605 A1 | 4/2006 | Neal et al. |
| 2006/0089427 A1 | 4/2006 | Yamamoto |
| 2006/0240346 A1 | 10/2006 | Toda et al. |
| 2006/0284951 A1 | 12/2006 | Ikeda et al. |
| 2007/0107630 A1 | 5/2007 | Neal et al. |
| 2007/0264437 A1 | 11/2007 | Zimmermann et al. |
| 2007/0275257 A1 | 11/2007 | Muraguchi et al. |
| 2008/0014110 A1 | 1/2008 | Thompson |
| 2008/0021115 A1 | 1/2008 | Ikematsu et al. |
| 2008/0047460 A1 | 2/2008 | Neal et al. |
| 2008/0047467 A1 | 2/2008 | Thompson |
| 2008/0075874 A1 | 3/2008 | Kelsoe |
| 2008/0124549 A1 | 5/2008 | Lee et al. |
| 2008/0276970 A1 * | 11/2008 | Cameron et al. ............... 134/27 |
| 2009/0053454 A1 | 2/2009 | Chiu et al. |

FOREIGN PATENT DOCUMENTS

| | | |
|---|---|---|
| DE | 3900303 | 7/1990 |
| EP | 0747184 | 12/1997 |
| EP | 2277954 | 1/2011 |
| GB | 593625 | 10/1947 |
| GB | 1547293 | 6/1979 |
| GB | 2433497 | 6/2007 |
| JP | 56038366 | 4/1981 |
| JP | 5719736 | 2/1982 |
| JP | 57036168 | 2/1982 |
| JP | 01305006 | 6/1988 |
| JP | 026488 | 1/1990 |
| JP | 0543838 | 2/1993 |
| JP | 08318509 | 12/1996 |
| JP | 09087115 | 3/1997 |
| JP | 10251599 | 3/1997 |
| JP | 09300312 | 11/1997 |
| JP | 1192694 | 4/1999 |
| JP | 200080354 | 3/2000 |
| PL | 148704 | 3/1990 |
| SE | 502117 | 8/1995 |
| SU | 310891 | 3/1970 |
| WO | 8502133 | 5/1985 |
| WO | 8502205 | 5/1985 |
| WO | 9113945 | 9/1991 |
| WO | 9702119 | 1/1997 |
| WO | 0121881 | 3/2001 |
| WO | 0193685 | 12/2001 |
| WO | 0197985 | 12/2001 |
| WO | 2004090065 | 10/2004 |

(56) References Cited

FOREIGN PATENT DOCUMENTS

| | | |
|---|---|---|
| WO | 2005019321 | 3/2005 |
| WO | 2006068118 | 6/2006 |
| WO | 2006078625 | 7/2006 |
| WO | 2007036906 | 4/2007 |
| WO | 2008124549 | 10/2008 |
| WO | 2008140743 | 11/2008 |
| WO | 2011146352 | 11/2011 |
| WO | 2012047312 | 4/2012 |
| WO | 2012047313 | 4/2012 |
| WO | 2012047314 | 4/2012 |
| WO | 2012064558 | 5/2012 |
| WO | 2012099719 | 7/2012 |

OTHER PUBLICATIONS

Hoch Verkehr List F, Preservation of concrete—by pre-drying and stepwise treatment with mixt. of methyl-polysiloxane in petrol or alkyl-silane in alchol, Nov. 16, 1988.

Unique Commercial Applications of the Sol-Gel Process in Japan (J. Sol-Gel Sci Techn. 2006.

\* cited by examiner

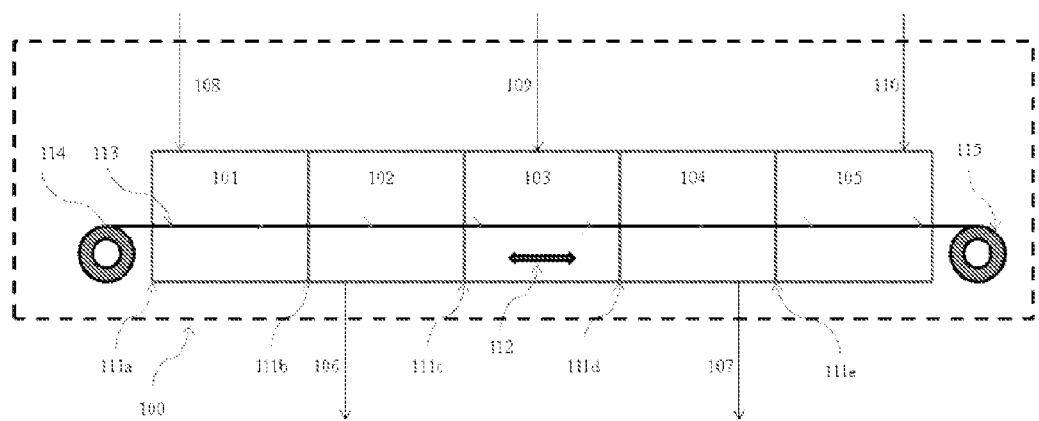

METHOD FOR TREATING SUBSTRATES WITH HALOSILANES

CROSS-REFERENCE TO RELATED APPLICATIONS AND STATEMENT REGARDING FEDERALLY SPONSORED RESEARCH

Cross Reference to Related Applications

This application is a U.S. national stage filing under 35 U.S.C. §371 of PCT Application No. PCT/US12/20284 filed on Jan. 5, 2012, which claims the benefit of U.S. Patent Application No. 61/433,616 filed Jan. 18, 2011 under 35 U.S.C. §119 (e). PCT Application No. PCT/US12/20284 and U.S. Patent Application No. 61/433,616 are hereby incorporated by reference.

TECHNICAL FIELD

A method for rendering a substrate hydrophobic includes treating the substrate with a halosilane vapor. The halosilane forms a silicone resin on the surface and in the interstitial spaces of the substrate.

BACKGROUND OF THE INVENTION

Cellulosic substrates such as paper and cardboard (e.g., including corrugated fiberboard, paperboard, display board, or card stock) products encounter various environmental conditions based on their intended use. For example, cardboard is often used as packaging material for shipping and/or storing products and must provide a durable enclosure that protects its contents. Some such environmental conditions these packaging materials may face are water through rain, temperature variations which may promote condensation, flooding, snow, ice, frost, hail or any other form of moisture. Other products include disposable food service articles, which are commonly made from paper or paperboard. These cellulosic substrates also face moist environmental conditions, e.g., vapors and liquids from the foods and beverages they come in contact with. Water in its various forms may threaten a cellulosic substrate by degrading its chemical structure through hydrolysis and cleavage of the cellulose chains and/or breaking down its physical structure via irreversibly interfering with the hydrogen bonding between the chains, thus decreasing its performance in its intended use. When exposed to water, other aqueous fluids, or significant amounts of water vapor, items such as paper and cardboard may become soft, losing form-stability and becoming susceptible to puncture (e.g., during shipping of packaging materials or by cutlery such as knives and forks used on disposable food service articles).

Manufacturers may address the problem of the moisture-susceptibility of disposable food service articles by not using the disposable food service articles in moist environments. This approach avoids the problem simply by marketing their disposable food service articles for uses in which aqueous fluids or vapor are not present (e.g., dry or deep-fried items). However, this approach greatly limits the potential markets for these articles, since many food products (1) are aqueous (e.g., beverages, soups), (2) include an aqueous phase (e.g., thin sauces, vegetables heated in water), or (3) give off water vapor as they cool (e.g., rice and other starchy foods, hot sandwiches, etc.).

Another way of preserving cellulosic substrates is to prevent the interaction of water with the cellulosic substrate. For example, water-resistant coatings (e.g., polymeric water-proofing materials such as wax or polyethylene) may be applied to the surfaces of the cellulosic substrates to prevent water from contacting the cellulosic substrates directly. This approach essentially forms a laminated structure in which a water-sensitive core is sandwiched between layers of a water-resistant material. Many coatings, however, are costly to obtain and difficult to apply, thus increasing manufacturing cost and complexity and reducing the percentage of acceptable finished products. Furthermore, coatings can degrade or become mechanically compromised and become less effective over time. Coatings also have the inherent weakness of poorly treated substrate edges. Even if the edges can be treated to impart hydrophobicity to the entire substrate, any rips, tears, wrinkles, or folds in the treated substrate can result in the exposure of non-treated surfaces that are easily wetted and can allow wicking of water into the bulk of the substrate.

Furthermore, certain coatings and other known hydrophobing treatments for cellulosic substrates may also render the substrates not biodegradable. Therefore, it would be desirable to provide a method for rendering cellulosic substrates hydrophobic as well as maintaining their biodegradability.

It would also be desirable to conduct the treatment method in a way that ensures not just that the substrate is rendered hydrophobic, but also the efficient operation of the process. For example, if a liquid mixture of halosilane with a volatile solvent is used to saturate a substrate such as paper, when the solvent is evaporated the paper may be rendered hydrophobic. However, a significant portion of the halosilane evaporates with the solvent in known processes. In a commercial operation this stream containing solvent and halosilane must be processed in some way.

One way to process the stream would be to condense the solvent and halosilane. Unfortunately, because the evaporation of the solvent from the paper removes some amount of water from the paper, condensing the mixed vapor causes water to condense as well. The condensed water reacts quickly with the condensed halosilane forming a siloxane plus hydrogen halide. When an organohalosilane, such as a monoorgano, trihalo silane condenses with water present, it forms solid by-products, which must be separated from the process and discarded. Thus practicing a liquid treatment method requires the handing of a by-product stream that includes a volatile solvent and a solid or even gelatinous mixture which includes a hydrogen halide.

Vapor treating methods have also been proposed. However when treating paper with vaporized halosilane using a known process, there is still a by-product stream to handle. The by-product stream includes solvent and the portion of the halosilane which did not react into the paper during treating.

There is a commercial need for a method that enables substrates such as paper to be treated using a halosilane with a large fraction of the halosilane remaining in the paper and not requiring treatment as a by-product stream.

BRIEF SUMMARY OF THE INVENTION

A method is useful for rendering a substrate hydrophobic. The method comprises:

I) exposing the substrate to turbulent flow of a vapor with a concentration comprising at least 90% of a halosilane in a treatment zone such that the vapor penetrates the substrate, and II) placing the substrate in a vent zone, where an inert gas is introduced into the vent zone to form a positive pressure in the vent zone. The concentration of the halosilane in the vent zone is lower than the concentration of the halosilane in the treatment zone.

BRIEF DESCRIPTION OF THE DRAWINGS

FIG. 1 is a process flow diagram of a method described herein.

REFERENCE NUMERALS 100 treatment apparatus
101 first inert gas inlet zone
102 first vapor outlet zone
103 treatment zone
104 second vapor outlet zone
105 second inert gas inlet zone
106 first vapor outlet
107 second vapor outlet
108 first inert gas inlet
109 halosilane vapor inlet
110 second inert gas inlet
111a zone divider
111b zone divider
111c zone divider
111d zone divider
111e zone divider
112 agitator
113 paper substrate
114 feed roll
115 uptake roll

DETAILED DESCRIPTION OF THE INVENTION

Definitions and Usage of Terms

All amounts, ratios, and percentages are by weight unless otherwise indicated. The articles 'a', 'an', and 'the' each refer to one or more, unless otherwise indicated by the context of specification. The disclosure of ranges includes the range itself and also anything subsumed therein, as well as endpoints. For example, disclosure of a range of 2.0 to 4.0 includes not only the range of 2.0 to 4.0, but also 2.1, 2.3, 3.4, 3.5, and 4.0 individually, as well as any other number subsumed in the range. Furthermore, disclosure of a range of, for example, 2.0 to 4.0 includes the subsets of, for example, 2.1 to 3.5, 2.3 to 3.4, 2.6 to 3.7, and 3.8 to 4.0, as well as any other subset subsumed in the range. Similarly, the disclosure of Markush groups includes the entire group and also any individual members and subgroups subsumed therein. For example, disclosure of the Markush group: an alkyl group, a cycloalkyl group, an alkenyl group, an alkynyl group, or an aryl group; includes the member alkyl individually; the subgroup alkyl and aryl; and any other individual member and subgroup subsumed therein.

For purposes of this application, the term "solvent free" means that no organic solvent is present, or that less than 1% organic solvent is present. (No solvent is intentionally added to the vapor; the 1% amount may be present as an impurity in the halosilane from the production process used to make the halosilane.)

The term "treated" (and its variants such as "treating," "treat," "treats," and "treatment") means applying the halosilane to the substrate in an appropriate environment for a sufficient amount of time for the halosilane to penetrate the substrate and react to form a resin. The term "penetrate" (and its variants such as "penetrating," "penetration", "penetrated", and "penetrates") means that the halosilane enters some or all of the interstitial spaces of the substrate, and the halosilane does not merely form a surface coating on the substrate.

The substrates useful in the method described herein may be biodegradable. For purposes of this application, the terms 'compostable,' and 'compostability' encompass factors such as biodegradability, disintegration, and ecotoxicity. The terms 'biodegradable,' 'biodegradability,' and variants thereof refer to the nature of the material to be broken down by microorganisms. Biodegradable means a substrate breaks down through the action of a microorganism, such as a bacterium, fungus, enzyme, and/or virus over a period of time. The term 'disintegration,' 'disintegrate,' and variants thereof refer to the extent to which the material breaks down and falls apart. Ecotoxicity testing determines whether the material after composting shows any inhibition on plant growth or the survival of soil or other fauna. Biodegradability and compostability may be measured by visually inspecting a substrate that has been exposed to a biological inoculum (such as a bacterium, fungus, enzyme, and/or virus) to monitor for degradation. Alternatively, the biodegradable substrate passes ASTM Standard D6400; and alternatively the biodegradable substrate passes ASTM Standard D6868-03. In general, rate of compostability and/or biodegradability may be increased by maximizing surface area to volume ratio of each substrate. For example, surface area/volume ratio may be at least 10, alternatively at least 17. Alternatively, surface area/volume ratio may be at least 33. Without wishing to be bound by theory, it is thought that a surface area/volume ratio of at least 33 will allow the substrate to pass the test for biodegradability in ASTM Standard D6868-03.

The phrase "different from" as used herein means two non-identical halosilanes so that the substrate is not treated with one single halosilane. For purposes of this application, a 'halosilane' is defined as a silane that has at least one halogen (such as, for example, chlorine or fluorine) directly bonded to silicon wherein, within the scope of this disclosure, silanes are defined as silicon-based monomers or oligomers that contain functionality that can react with water, the —OH groups on the substrates (e.g., cellulosic substrates) and/or sizing agents or additional additives applied to the substrates as appreciated herein. Halosilanes with a single halogen directly bonded to silicon are defined as monohalosilanes, halosilanes with two halogens directly bonded to silicon are defined as dihalosilanes, halosilanes with three halogens directly bonded to silicon are defined as trihalosilanes and halosilanes with four halogens directly bonded to silicon are defined as tetrahalosilanes.

For purposes of this application, the terms 'hydrophobic' and 'hydrophobicity,' and variants thereof, refer to the water resistance of a substrate. Hydrophobicity may be measured according to the Cobb test set forth in Reference Example 1, below. The substrates treated by the method described herein may also be inherently recyclable. The substrates may also be repulpable, e.g., the hydrophobic substrate prepared by the method described herein may be reduced to pulp for use in making paper. The substrates may also be repurposeable.

For purposes of this application, the term 'vapor' as used with respect to the halosilane used to treat the substrate, refers to the sum of ingredients that penetrate and treat the paper. For the avoidance of doubt, the term 'vapor' in this context; excludes water vapor, air, inert gas and solvent.

Method

A method for rendering a substrate hydrophobic comprises the steps of:
I) exposing the substrate to turbulent flow of a vapor with a concentration comprising at least 90% of a halosilane in a treatment zone such that the vapor penetrates the substrate,
II) placing the substrate in a vent zone, where an inert gas is introduced into the vent zone to form a positive pressure in the vent zone, and where by-products are removed with the inert gas,
where the concentration of the halosilane in the vent zone is lower than the concentration of the halosilane in the treatment zone.

The method may optionally further comprise the step of, before step I), placing the substrate in an inert zone, where an additional inert gas is introduced to form a positive pressure in the inert zone, and the inert zone is separated from the treatment zone.

Substrate

The method may be continuous or semi-batch. When the method is continuous, the substrate may be continuous. An example of a continuous substrate is a roll of paper. The paper may be supplied on a roll, unwound and passed through the zones described herein, and collected on an uptake roll. Alternatively, the substrate is exemplified by, but not limited to building materials; cellulosic substrates such as wood and/or wood products (e.g., boards, plywood, planking for fences and/or decks, telephone poles, railroad ties, or fiberboard), paper (such as cardboard, boxboard, wallboard, paper used to coat insulation or liners used to make corrugated cardboard), or textiles; insulation; drywall (such as sheet rock); masonry brick; or gypsum. The substrate may comprise a single, flat, substrate (such as a single flat piece of paper or wallboard) or may comprise a folded, assembled or otherwise manufactured substrate. For example, the substrate can comprise multiple substrates glued, rolled or woven together (such as a corrugated assembly including a medium and one or two liners on a surface of the medium or a box) or can comprise varying geometries (such as a masonry brick). Alternatively, the substrate can be a subset component of a larger substrate such as when the substrate is combined with plastics, fabrics, non-woven materials and/or glass. It should be appreciated that substrates may thereby embody a variety of different materials, shapes and configurations and should not be limited to the exemplary embodiments expressly listed herein. When the substrate is not continuous, the method may be operated in a semi-batch mode, for example, by placing the substrates (e.g., planks or bricks or cardboard boxes) on a conveyor and passing the substrates through the zones described herein.

In an alternative method, the substrate should be dried slightly immediately before being treated with the halosilane. The moisture that is picked up during storage of the substrate, for example paperboard, particularly during humid conditions, can inhibit the depth that the treatment penetrates. So for example, one may want to pass the paper board through a drying zone immediately before the paper enters the treatment chamber.

In the method described herein, the zones are configured to minimize the amount of halosilane vapor (not penetrating the substrate) leaving the treatment zone. One means for minimizing loss of halosilane is by introducing the inert gas into the vent zone downstream of a vent zone outlet where the by-products are removed. The zones may be, for example, different chambers separated by zone dividers. The treatment zone and the vent zone may be separated by one or more zone dividers, such as a curtain or soft baffle. The treatment zone and the inert zone may be separated by one or more zone dividers. Additional inert gas may be introduced into the inert zone upstream of an inert zone outlet where the by-products are removed. In addition, one or more intermediate zones may be used in the method, e.g., the substrate may be passed through an intermediate zone located between the treatment zone and the vent zone, where the intermediate zone has a lower concentration of halosilane than the treatment zone and a higher concentration of halosilane than the vent zone. The vapor entering the treatment zone comprises at least 90% halosilane. Alternatively, the vapor may consist essentially of the halosilane. Alternatively, the vapor may be solvent-free. Alternatively, the vapor may comprise 90% to 100% of a halosilane, and 0 to 10% of an additional ingredient.

Halosilane

In the method described herein, the substrate is treated with a halosilane, alternatively a plurality of halosilanes, alternatively a chlorosilane, and alternatively, a plurality of chlorosilanes. When a plurality of halosilanes is used, the plurality of halosilanes comprises at least a first halosilane and a second halosilane different from the first halosilane. Monomeric halosilanes can comprise the formula $R_a SiX_b H_{(4-a-b)}$ where subscript a has a value ranging from 0 to 3, or alternatively, a=0-2, subscript b has a value ranging from 1 to 4, or alternatively, b=2-4, each X is independently chloro, fluoro, bromo or iodo, or alternatively, each X is chloro, and each R is independently a monovalent hydrocarbon group, or alternatively each R is an alkyl, alkenyl, aryl, aralkyl, or alkaryl group containing 1 to 20 carbon atoms. Alternatively, each R is independently an alkyl group containing 1 to 11 carbon atoms, an aryl group containing 6 to 14 carbon atoms, or an alkenyl group containing 2 to 12 carbon atoms. Alternatively, each R is methyl or octyl. One such exemplary halosilane is methyltrichlorosilane or $MeSiCl_3$ where Me represents a methyl group ($CH_3$). Another exemplary halosilane is dimethyldichlorosilane or $Me_2SiCl_2$. Further examples of halosilanes include (chloromethyl)trichlorosilane, [3-(heptafluoroisopropoxy)propyl]trichlorosilane, 1,6-bis(trichlorosilyl)hexane, 3-bromopropyltrichlorosilane, bromotrimethylsilane, allylbromodimethylsilane, allyltrichlorosilane, (bromomethyl)chlorodimethylsilane, chloro(chloromethyl)dimethylsilane, bromodimethylsilane, chloro(chloromethyl)dimethylsilane, chlorodiisopropyloctysilane, chlorodiisopropylsilane, chlorodimethylethylsilane, chlorodimethylphenylsilane, chlorodimethylsilane, chlorodiphenylmethylsilane, chlorotriethylsilane, chlorotrimethylsilane, dichloromethylsilane, dichlorodimethylsilane, dichloromethylvinylsilane, diethyldichlorosilane, diphenyldichlorosilane, di-t-butylchlorosilane, ethyltrichlorosilane, iodotrimethylsilane, octyltrichlorosilane, pentyltrichlorosilane, propyltrichlorosilane, phenyltrichlorosilane, triphenylsilylchloride, tetrachlorosilane, trichloro(3,3,3-trifluoropropyl)silane, trichloro(dichloromethyl)silane, trichlorovinylsilane, hexachlorodisilane, 2,2-dimethylhexachlorotrisilane, dimethyldifluorosilane, or bromochlorodimethylsilane. These and other halosilanes can be produced through methods known in the art or purchased from suppliers such as Dow Corning Corporation of Midland, Mich., USA, Momentive Performance Materials of Albany, N.Y., USA, or Gelest, Inc. of Morrisville, Pa., USA. Furthermore, while specific examples of halosilanes are explicitly listed herein, the above-disclosed examples are not intended to be limiting in nature. Rather, the above-disclosed list is merely exemplary and other halosilane compounds, such as other monomeric halosilanes, oligomeric halosilanes and polyfunctional halosilanes, may also be used so long as the vapor pressure of the halosilane compound is sufficient to allow for vaporization of the halosilane compound.

When a plurality of halosilanes is used, the plurality of halosilanes may be provided such that each halosilane comprises a mole percent of a total halosilane concentration. For example, where the plurality of halosilanes comprises only two halosilanes, the first halosilane will comprise X' mole percent of the total halosilane concentration while the second halosilane will comprise 100–X' mole percent of the total halosilane concentration. To promote the formation of a resin when treating the substrate with the plurality of halosilanes as will become appreciated herein, the total halosilane concentration of the plurality of halosilanes can comprise 20 mole percent or less of monohalosilanes, 70 mole percent or less of monohalosilanes and dihalosilanes (i.e., the total amount of monohalosilanes and dihalosilanes when combined does not exceed 70 mole percent), and at least 30 mole percent of trihalosilanes and tetrahalosilanes (i.e., the total amount of trihalosilanes and tetrahalosilanes when combined comprises at least 30 mole percent). In another embodiment, total halosilane concentration of the plurality of halosilanes can comprise 30 mole percent to 80 mole percent of trihalosilanes and/or tetrahalosilanes, or alternatively, 50 mole percent to 80 mole percent of trihalosilanes and/or tetrahalosilanes.

For example, in one exemplary embodiment, the first halosilane can comprise a trihalosilane (such as $MeSiCl_3$) and the second halosilane can comprise a dihalosilane (such as $Me_2SiCl_2$). The first and second halosilanes (e.g., the trihalosilane and dihalosilane) can be combined such that the trihalosilane can comprise X' percent of the total halosilane concentration where X' is 90 mole percent to 50 mole percent, 80 mole percent to 55 mole percent, or 65 mole percent to 55 mole percent. These ranges are intended to be exemplary only and not limiting in nature and that other variations or subsets may alternatively be utilized.

Additional Ingredients

The vapor used in the method may optionally further comprise greater than 0% to 10% of an additional ingredient. The additional ingredient may be a pesticide, fungicide, flame retardant, a mildewicide, a colorant such as paint and/or stain, a fragrance, or a combination thereof.

Step 1)

In step 1) of the method, the vapor described above may be introduced at or near center of the treatment zone. Turbulent flow of the vapor in the treatment zone may be achieved by any convenient means, such as agitating the vapor in the treatment zone using a mixer such as an agitator or impeller blade, or installing baffles in a chamber used for the treatment zone. The vapor may be introduced perpendicular to the substrate. The method parameters, which allow the halosilane to penetrate the substrate, such as time the substrate spends inside the treatment zone, temperature, pressure, and feed rate of the vapor will vary depending on desired process outcomes. For example, the method parameters may be selected such that the total time the substrate spends inside the treatment zone ranges from 1 second to 10 seconds. The feed rate of the vapor may be controlled using various computer control schemes. For example, the feed rate of the vapor may be adjusted based upon speed, width, and thickness of the substrate being treated. Alternatively, the feed rate of the vapor may be adjusted based upon amount of halosilane entering the vent zone. Alternatively, the feed rate of the vapor may be adjusted based on a calculated amount of halosilane imparted to the substrate. The exact temperature selected depends on various factors including the degradation temperature of the substrate and the reactivity of the halosilane selected, however, the temperature of the vapor may be maintained above condensation temperature of the halosilane in the treatment zone. Alternatively, the temperature of the substrate entering the treatment zone may range from 68° F. to 203° F. (20° C. to 95° C.). Alternatively, the method may be performed under vacuum, which could minimize the temperature.

Step II)

To increase the rate of reaction, the substrate can also optionally be heated and/or exposed to steam, after the halosilane penetrates the substrate, to produce the resin in the substrate. For example, the substrate can pass through a heating zone in which heat is applied to the substrate. The temperature of the heating zone will depend on the type of substrate and its residence time therein; however, the temperature in the heating zone may comprise a temperature in excess of 200° C. Alternatively, the temperature can vary depending on factors including the type of substrate, the speed in which the substrate passes through the heating zone, the thickness of the substrate, the amount of the halosilane applied to the substrate, and/or whether the method is performed at atmospheric pressure or under vacuum. Alternatively, the temperature provided to the substrate may be sufficient to heat the substrate to 200° C. upon its exit from the heating zone. Alternatively, the temperature provided may be sufficient to heat the substrate to 150° C., alternatively 100° C., and alternatively 65° C. upon its exit from the heating zone.

Once the substrate is treated to render it hydrophobic, the hydrophobic substrate will comprise a silicone resin resulting from the reaction between the halosilane and the cellulosic substrate and/or the water within the substrate as discussed above. The resin can comprise anywhere from greater than 0% of the hydrophobic substrate to 10%, alternatively greater than 0% to less than 1% of the hydrophobic substrate. The percent refers to the weight of the resin with respect to the overall weight of both the substrate and the resin. Other ranges of the amount of resin in the substrate include 0.01% to 0.99%, alternatively, 0.1% to 0.9%, alternatively 0.3% to 0.8%, and alternatively 0.3% to 0.5%. Without wishing to be bound by theory, it is thought that an amount of resin in the substrate less than that described above may provide insufficient hydrophobicity for the applications described herein, such as packaging material and disposable food service articles. At higher amounts of resin than 1%, it may be more difficult to compost the substrate at the end of its useful life.

Most of the halosilane stays in the paper (e.g., at least 60%, alternatively 60% to 100%, and alternatively 60% to 85%) using the treatment method described herein. When the halosilane reacts to form the silicone resin, by-product acid (e.g., HX) is produced upon hydrolysis of the halosilane. The by-product HX also stays in the paper.

Optional Step III)

The method described above may optionally further comprise step III), exposing the substrate to a basic compound after step II). The term 'basic compound' refers to any chemical compound that has the ability to react with and neutralize the acid (e.g., HX) produced upon hydrolysis of the halosilane. For example, in one embodiment, the halosilane may be applied to the substrate and passed through a neutralization zone containing ammonia gas such that the substrate is exposed to the ammonia gas. Without intending to be bound by a particular theory, the basic compound may both neutralize acids generated from applying the halosilane to the substrate and further drive the reaction between the halosilane and water, and/or the substrate, to completion. Other non-limiting examples of useful basic compounds include both organic and inorganic bases such as hydroxides of alkali metals or amines. Alternatively, any other base and/or condensation catalyst may be used in whole or in part in place of the ammonia and delivered as a vapor. In this context, the term "condensation catalyst" refers to any catalyst that can affect reaction between two silanol groups or a silanol group and a group formed in situ as a result of the reaction of the halosilane with water or an —OH group (e.g., bonded to cellulose when a cellulosic substrate is used in the method) to produce a siloxane linkage. Alternatively, the substrate may be exposed to the basic compound before, simultaneous with or after the halosilane is applied, or in combinations thereof.

FIG. 1

FIG. 1 shows a process flow diagram for the method described herein. A substrate (shown here as paper 113 on a feed roll 114) passes through a treatment apparatus 100 and is collected on an uptake roll 115. The substrate 113 enters an inert zone comprised of first inert gas inlet zone 101 and first vapor outlet zone 102. Inert gas is introduced into the inert zone through inert gas inlet 108. Inert gas inlet zone 101 and first vapor outlet zone 102 may comprise one single chamber, alternatively, inert gas inlet zone 101 and first vapor outlet zone 102 may comprise separate chambers separated by a zone divider 111b. Each of the zone dividers 111a-e used herein may be, for example, a curtain or soft baffle.

The substrate 113 passes through a zone divider 111c into treatment zone 103. Vapor comprising at least 90% of a halosilane is introduced into treatment zone 103 through halosilane inlet 109. The vapor may be introduced by any convenient means, such as through a nozzle or orifice (not shown). The vapor may be directed perpendicular to the substrate 113. The vapor has turbulent flow. The substrate 113 is exposed to turbulent flow of the vapor in treatment zone 103. Turbulent flow may be achieved by any convenient means, such as use of an agitator or impeller 112 in the treatment zone. Alternatively, turbulent flow may be achieved by using baffles (not shown) in treatment zone 103 or by selection of vapor flow rate through the halosilane inlet 109, or combinations thereof. The vapor penetrates the substrate in the treatment zone 103.

The substrate 113 passes through a zone divider 111d into a vent zone comprised of second vapor outlet zone 104 and second inert gas inlet zone 105. The second vapor outlet zone 104 and the second inert gas inlet zone 105 may comprise one single chamber, alternatively second vapor outlet zone 104 and the second inert gas inlet zone 105 may optionally be separated by a zone divider 111e.

One skilled in the art would recognize that FIG. 1 is exemplary and not limiting. Modifications may be made without limiting the scope of the invention set forth in the claims. For example, first inert gas inlet zone 101 and first vapor outlet zone 102 may be combined in one chamber, e.g., zone divider 111b may be absent.

In an alternative embodiment, first inert gas inlet zone 101 and first vapor outlet zone 102 may be eliminated. A noncontinuous substrate may be used instead of the continuous paper 113 going from feed roll 114 to uptake roll 115. For example, a conveyor (not shown) may be used instead, and discontinuous substrates, such as planks, bricks, or other articles to be treated may be placed on the conveyor and passed from the treatment zone 103 into the vent zone.

Alternatively, second vapor outlet zone 104 and second inert gas inlet zone 105 may be combined in one chamber, e.g., zone divider 111e may be absent. Alternatively, one or more intermediate zones may be present (optionally separated by zone dividers) between treatment zone 103 and second vapor outlet zone 104, between second vapor outlet zone 104 and second inert gas inlet zone 105, or both.

Alternatively, one or more additional zones may be added to the method. For example, an intermediate zone may be added at one or more locations selected from before first inert gas inlet zone 101, between first inert gas inlet zone 101 and first vapor outlet zone 102, between first vapor outlet zone 102 and treatment zone 103, between treatment zone 103 and second vapor outlet zone 104, between second vapor outlet zone 104 and second inert gas inlet zone 105, and/or after second inert gas outlet zone 105; all such zones being optionally separated by zone dividers.

The method may be performed under ambient conditions of pressure. Alternatively, the method may be performed at reduced pressure in one or more zones. The method may include heating in one or more zones. For example, the treatment zone, and any other zone in which halosilane is present, may be maintained at a temperature above the condensation temperature of the halosilane to minimize potential for corrosion of the apparatus used for treating the substrate.

EXAMPLES

The following examples are included to demonstrate the invention to one of ordinary skill. However, those of ordinary skill in the art should, in light of the present disclosure, appreciate that many changes can be made in the specific embodiments which are disclosed and still obtain a like or similar result without departing from the spirit and scope of the invention.

Reference Example 1

Treatment Procedure, Cobb Sizing Test and Immersion Test, and Strength Evaluation Unbleached kraft papers (24 pt and 45 pt), which were light brown in color, were treated with various solutions containing chlorosilanes in pentane. The papers were drawn through a machine as a moving web where the treatment solution was applied. The line speed was typically 10 feet/minute to 30 ft/min, and the line speed and flow of the treating solution were adjusted so that complete soak-through of the paper was achieved. The paper was then exposed to sufficient heat and air circulation to remove solvent and volatile silanes. The paper was then exposed to an atmosphere of ammonia to neutralize HCl. The hydrophobic attributes of the treated papers were then evaluated via the Cobb sizing test and immersion in water for 24 hours.

The Cobb sizing test was performed in accordance with the procedure set forth in TAPPI testing method T441 where a 100 cm$^2$ surface of the paper was exposed to 100 milliliters (mL) of 50° C. deionized water for three minutes. The reported value was the mass (g) of water absorbed per square meter (g/m$^2$) by the treated paper.

The deposition efficiency was calculated from the amount of chlorosilane(s) applied to the cellulosic substrate using the known variables of solution concentration, solution application rate, and paper feed rate. The amount of resin contained in the treated paper was determined by converting the resin to monomeric siloxane units and quantifying such using gas chromatography pursuant to the procedure described in "The Analytical Chemistry of Silicones," Ed. A. Lee Smith. Chemical Analysis Vol. 112, Wiley-Interscience (ISBN 0-471-51624-4), pp 210-211. The deposition efficiency was then determined by dividing the amount of resin in the paper by the amount of chlorosilane(s) applied.

Examples of the Method

Experimental runs were completed to demonstrate the improvement in silicon efficiency possible when practicing the method described herein. A roll of paper was fed through a chamber. For the examples, the chamber was divided into zones separated by Viton foam zone dividers. The length of the chamber was 3 feet. The halosilane vapor was introduced into the top and bottom of the treatment zone perpendicular to the top and bottom of the paper. The low speed runs were at 50 feet per minute with an exposure time of 3.6 seconds. The low speed of paper corresponded to 1750 gm/minute of paper. The high speed runs were at 100 feet per minute with the same sized enclosure, so exposure time was 1.8 seconds. The high speed of paper corresponded to 3500 gm/minute of paper. The paper was six inches wide and 45 pt in thickness from Rock-Tenn Corporation. The vapor fed to the treatment zone was 100% $MeSiCl_3$ or a 50:50 mixture of $Me_2SiCl_2$ and $MeSiCl_3$. The low halosilane rate was 20 gm/minute. The high halosilane rate was 40 gm/minute. For the examples performed with heating, a heating plate directly beneath the treatment zone had hot oil at 150° C. circulated through the heating plate. This kept the chamber surrounding the treatment zone at the boiling point of $MeSiCl_3$. For examples when heat was not applied, hot oil was not circulated through the heating plate (and the method was performed at ambient temperature).

It was observed that the temperature of the paper increased after treatment. Without wishing to be bound by theory, it is thought that this was because of the heat produced by the HCl being absorbed into the water in the paper and/or reacting with minerals in the paper. This temperature increase appeared quantitative and could be used in a control scheme for the method (e.g., to control the amount of halosilane fed or the speed of the paper).

A summary of the efficiencies with two feed combinations is presented in Table 1. In the comparative examples labeled "No Baffles" the paper board passed from the vented inert zone into the treatment zone and then out of the treatment zone into the vent zone with the Viton foam zone dividers removed. In all other examples at least one zone divider was added. Various configurations were evaluated. In general, dividing the chamber into at least one separate treatment zone and vent zone provided improved efficiency. The efficiencies and baffle configurations for separating the treatment zones from the vent zones are described below in Table 1.

TABLE 1

| Example | Description | Paper Speed (ft/min) | Halosilane Rate (gm/min) | Efficiency |
|---|---|---|---|---|
| Comparative Example 1 | Comparative example with no baffles inside the treatment chamber | 50 | 22.9 | 37% |
| Comparative Example 2 | Comparative example with no baffles inside the treatment chamber | 100 | 42.1 | 30% |
| Example 1 | Baffles approximately 6 inches to the left and 6 inches to the right of the vapor feed point | 50 | 25.7 | 62% |
| Example 2 | Baffles approximately 6 inches to the left and 6 inches to the right of the vapor feed point | 100 | 42.1 | 55% |
| Example 3 | Baffles approximately 12 inches to the left and 12 inches to the right of the vapor feed point | 50 | 18.6 | 71% |
| Example 4 | Baffles approximately 12 inches to the left and 12 inches to the right of the vapor feed point | 100 | 44.0 | 52% |
| Example 5 | Baffles approximately 12 inches to the left and 6 inches to the right of the vapor feed point | 50 | 18.4 | 74% |
| Example 6 | Baffles approximately 12 inches to the left and 6 inches to the right of the vapor feed point | 100 | 42.5 | 61% |
| Example 7 | Baffles approximately 6 inches to the left and 12 inches to the right of the vapor feed point | 50 | 16.8 | 67% |
| Example 8 | Baffles approximately 6 inches to the left and 12 inches to the right of the vapor feed point | 100 | 40.9 | 35% |
| Example 9 | Baffles approximately 12 inches to the left and 6 inches to the left and 6 inches to the right and 12 inches to the right of the vapor feed point | 50 | 20.6 | 65% |
| Example 10 | Baffles approximately 12 inches to the left and 6 inches to the left and 6 inches to the right and 12 inches to the right of the vapor feed point | 100 | 39.2 | 44% |
| Example 11 | Baffles approximately 12 inches to the left and 6 inches to the left and 6 inches to the right and 12 inches to the right of the vapor feed point without adding heat to bottom of the chamber | 50 | 23.0 | 38% |
| Example 12 | Baffles approximately 12 inches to the left and 6 inches to the left and 6 inches to the right and 12 inches to the right of the vapor feed point without adding heat to bottom of the chamber | 100 | 43.5 | 59% |
| Example 13 | Baffles approximately 12 inches to the left and 6 inches to the left and 6 inches to the right and 12 inches to the right of the vapor feed point, feeding a mixture of MeSiCl3 and Me2SiCl2 | 50 | 17.7 | 54% |
| Example 14 | Baffles approximately 12 inches to the left and 6 inches to the left and 6 inches to the right and 12 inches to the right of the vapor feed point, feeding a mixture of $MeSiCl_3$ and $Me_2SiCl_2$ | 100 | 38.3 | 58% |

TABLE 1-continued

| Example | Description | Paper Speed (ft/min) | Halosilane Rate (gm/min) | Efficiency |
|---|---|---|---|---|
| Example 15 | Baffles approximately 12 inches to the left and 6 inches to the left and 6 inches to the right and 12 inches to the right of the vapor feed point without adding heat to bottom of the chamber | 50 | 20.7 | 58% |
| Example 16 | Baffles approximately 12 inches to the left and 6 inches to the left and 6 inches to the right and 12 inches to the right of the vapor feed point without adding heat to bottom of the chamber | 100 | 42.2 | 64% |
| Example 17 | Baffles approximately 12 inches to the left and 6 inches to the left and 6 inches to the right and 12 inches to the right of the vapor feed point, with feed directed parallel to the paper and in the opposite direction of the paper direction | 50 | 16.9 | 85% |
| Example 18 | Baffles approximately 12 inches to the left and 6 inches to the left and 6 inches to the right and 12 inches to the right of the vapor feed point, with feed directed parallel to the paper and in the opposite direction of the paper direction | 100 | 44.1 | 59% |

I claim:

1. A method for rendering a substrate hydrophobic comprising:
    providing a feedroll feeding a treatable substrate;
    moving a portion of the treatable substrate from the feedroll through a first zone divider into an inert gas inlet zone;
    introducing inert gas into the inert gas inlet zone and producing a positive pressure of the inert gas in the inert gas inlet zone;
    moving the treatable substrate through a second zone divider, the second zone divider separating the inert gas inlet zone from a treatment zone;
    moving the treatable substrate into the treatment zone;
    forming a treated substrate by exposing the treatable substrate to turbulent flow of a vapor with a concentration comprising at least 90% of a halosilane in the treatment zone such that the vapor penetrates the substrate, the halosilane reacting with at last a portion of the treatable substrate to produce HCl; and
    wherein the temperature of the vapor is maintained above condensation temperature of the halosilane in the treatment zone; and
    moving the treated substrate through a third zone divider, the third zone divider separating the treatment zone from a neutralization zone;
    moving the treated substrate into the neutralization zone and exposing at least a portion of the substrate to a basic compound to at least partially neutralize the HCl while at least a portion of the treatable substrate is exposed to the halosilane in the treatment zone;
    moving the treated substrate into a positive pressure zone coupled to at least one vapor outlet and including an inert gas inlet;
    flowing inert gas through the inert gas inlet forming a positive pressure of the inert gas within the positive pressure zone and a flow of inert gas with by-products through the at least one vapor outlet; and
    rolling the treated substrate onto an uptake roll substantially continuously as treatable substrate is fed from the feedroll.

2. The method of claim 1, wherein the vapor consists essentially of the halosilane and the vapor is substantially free of added solvent.

3. The method of claim 2, wherein the halosilane comprises chlorosilane.

4. The method of claim 2, wherein the total time the substrate spends inside the treatment zone ranges from 1 second to 10 seconds.

5. The method of claim 1, wherein the vapor is introduced at or near center of the treatment zone; and
    wherein the turbulent flow of the vapor is produced by a mixer in the treatment zone.

6. The method of claim 1, wherein the total time the substrate spends inside the treatment zone ranges from about 1 second to about 10 seconds.

7. The method of claim 1, wherein the substrate is selected from cellulosic substrates derived from wood, textiles, or insulation.

8. The method of claim 1, further comprising passing the substrate through an intermediate zone located between the treatment zone and the positive pressure zone, where the intermediate zone has a lower concentration of halosilane than the treatment zone and a higher concentration of halosilane than the positive pressure zone.

9. The method of claim 1, wherein a feed rate of the halosilane into the treatment zone is adjusted by a computer program, the method comprising the steps of:
    i) receiving a request from a device for feeding the halosilane to the treatment zone;
    ii) receiving input data comprising speed, width, and thickness of the substrate being treated;
    iii) executing the computer program to generate an updated feed rate based on the input data received in step ii); and
    iv) forwarding the updated feed rate to the device for feeding the halosilane.

10. The method of claim 1, wherein the method is continuous.

11. The method of claim 1, wherein the basic compound comprises an organic base.

12. The method of claim 1, wherein the basic compound comprises an inorganic base.

13. The method of claim 1, wherein the basic compound comprises ammonia.

14. The method of claim 13, wherein the ammonia is substantially pure ammonia gas.

15. The method of claim 1, wherein the treated substrate is heated following halosilane penetration.

16. The method of claim 15, wherein the treated substrate is heated above 200° C.

17. The method of claim 15, wherein the treated substrate is heated to a temperature between about 100° C. and about 150° C.

18. The method of claim 15, wherein the treated substrate is heated to a temperature of about 65° C.

* * * * *